(12) United States Patent
Okamoto

(10) Patent No.: US 7,256,431 B2
(45) Date of Patent: Aug. 14, 2007

(54) INSULATING SUBSTRATE AND SEMICONDUCTOR DEVICE HAVING A THERMALLY SPRAYED CIRCUIT PATTERN

(75) Inventor: Kenji Okamoto, Yokosuka (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 0 days.

(21) Appl. No.: 11/283,854

(22) Filed: Nov. 22, 2005

(65) Prior Publication Data

US 2006/0108601 A1    May 25, 2006

(30) Foreign Application Priority Data

Nov. 25, 2004  (JP)  .................. 2004-339860
Aug. 4, 2005  (JP)  .................. 2005-226990

(51) Int. Cl.
| | |
|---|---|
| H01L 31/111 | (2006.01) |
| H01L 31/101 | (2006.01) |
| H01L 23/12 | (2006.01) |
| H01L 23/48 | (2006.01) |
| H01L 23/498 | (2006.01) |

(52) U.S. Cl. ......... 257/177; 257/E23.08; 257/E23.189; 257/E23.206; 257/E25.025; 257/668; 257/758; 257/178; 257/182; 257/700; 257/701; 257/703; 257/677

(58) Field of Classification Search .......... 257/E23.08, 257/E23.189, E23.106, E23.025, 668, 758, 257/177, 178, 182, 700, 701, 703, 677
See application file for complete search history.

(56) References Cited

U.S. PATENT DOCUMENTS

| | | | | |
|---|---|---|---|---|
| 5,276,423 | A | * | 1/1994 | Breit et al. .................. 338/308 |
| 5,354,415 | A | * | 10/1994 | Fushii et al. .................. 216/13 |
| 6,222,166 | B1 | * | 4/2001 | Lin et al. .................... 219/538 |
| 6,734,542 | B2 | * | 5/2004 | Nakatani et al. ............ 257/687 |

FOREIGN PATENT DOCUMENTS

| | | |
|---|---|---|
| JP | 2003-218269 | 7/2003 |
| JP | 2004-047863 | 2/2004 |
| JP | 2004-095793 | 3/2004 |

\* cited by examiner

*Primary Examiner*—Alexander Oscar Williams
(74) *Attorney, Agent, or Firm*—Manabu Kanesaka

(57) ABSTRACT

An insulating substrate includes a metal base as a base member, an insulating layer which is a room temperature, aerosol deposited shock solidification film formed on the metal base, and a circuit pattern which is a cold sprayed thermal spray coating formed on the insulating layer. A semiconductor device incorporates the insulating substrate, and thereby has improved heat radiation characteristics.

14 Claims, 5 Drawing Sheets

Fig. 2(a) AEROSOL DEPOSITION
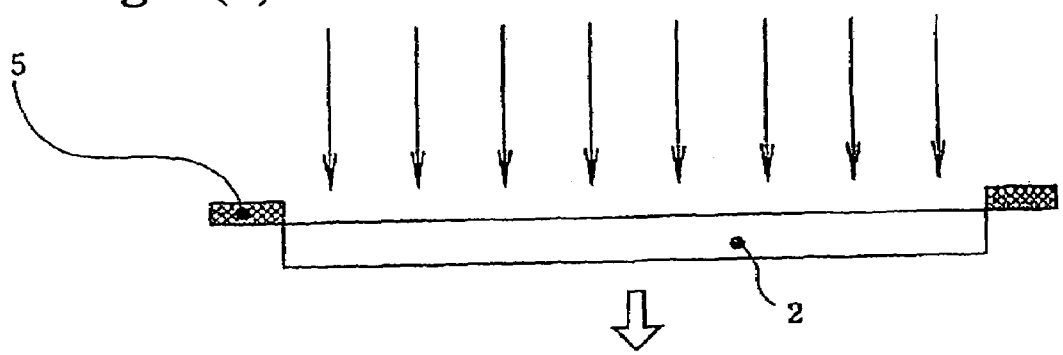
Fig. 2(b)
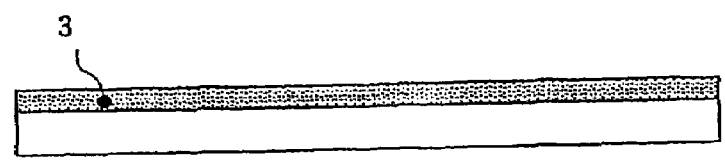
Fig. 2(c) COLD SPRAYING
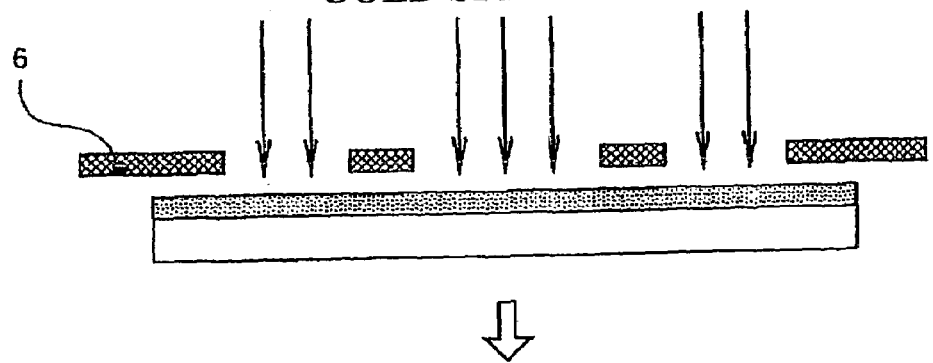
Fig. 2(d)
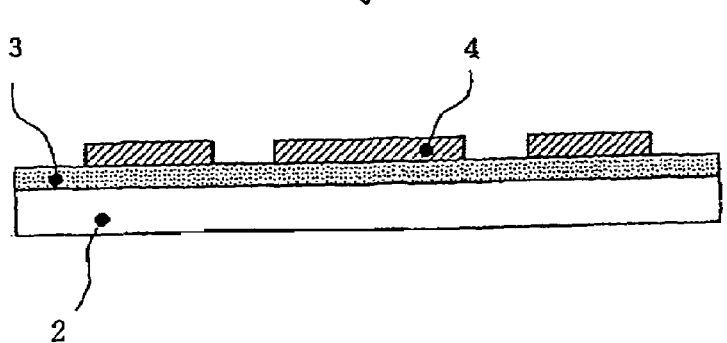

FIG. 5 [PRIOR ART]
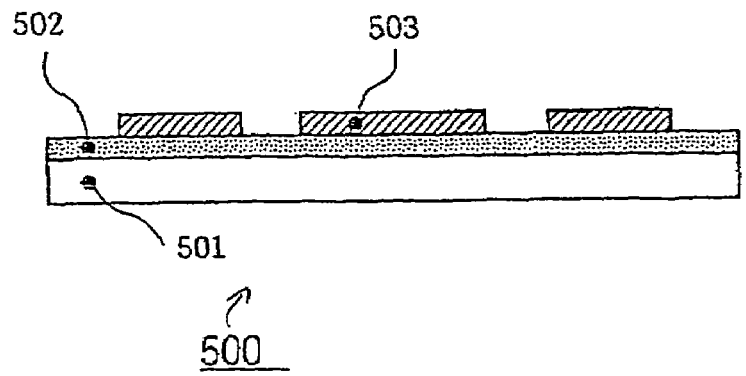
FIG. 6 (a) [PRIOR ART]
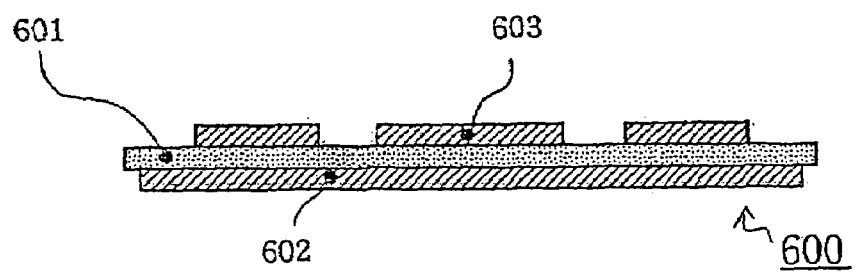
FIG. 6 (b) [PRIOR ART]
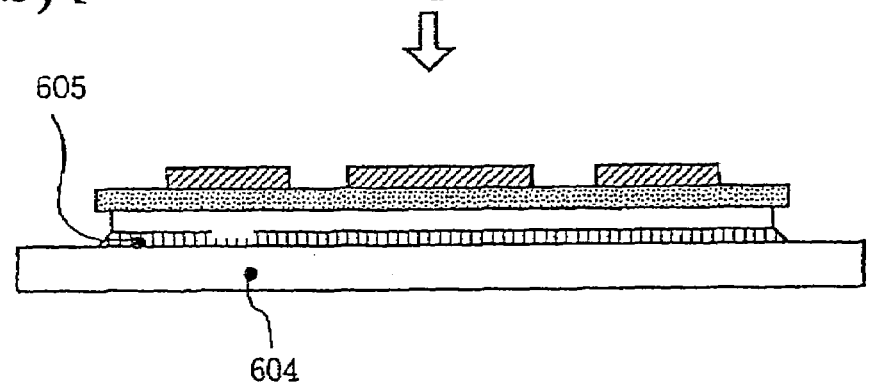

INSULATING SUBSTRATE AND SEMICONDUCTOR DEVICE HAVING A THERMALLY SPRAYED CIRCUIT PATTERN

BACKGROUND OF THE INVENTION AND RELATED ART STATEMENT

The present invention relates to an insulating substrate with increased heat radiation ability and a semiconductor device incorporating such an insulating substrate.

Semiconductor devices having a power conversion function are applied to a wide range of apparatus including consumer apparatus such as home air conditioners and refrigerators and industrial apparatus such as inverters and servo controllers.

In such semiconductor devices, insulating substrates are being developed diligently because reduction of the thermal resistance of the insulating substrate particularly contributes to improvement of the heat radiation characteristic.

A conventional technique relating to such an insulating substrate will be described below with reference to the drawings. FIG. 5 is a sectional view showing the structure of a conventional insulating substrate 500. The insulating substrate 500 is provided with a metal base 501, an insulating layer 502, and a circuit pattern 503.

The metal base 501 is an aluminum plate, an aluminum alloy plate, a copper plate, a copper alloy plate, or the like.

The insulating layer 502 is an insulating layer formed by solidifying an epoxy resin containing an inorganic filler such as silicon oxide ($SiO_2$), aluminum oxide ($Al_2O_3$), or aluminum nitride (AlN), and currently has thermal conductivity of about 7.0-10.0 W/m·K.

For example, the circuit pattern 503 is a copper thin film pattern.

Because of its superior heat dissipation performance, the insulating substrate 500 having the above three-layer structure is used as a wiring substrate on which high heat generation components such as power semiconductor devices are mounted. In particular, the insulating substrate 500 is used as a substrate for a wiring board of a power circuit module which is used in a power supply apparatus. Since as described above its thermal conductivity is currently about 7.0-10.0 W/m·K, the insulating substrate 500 can currently be applied to a power circuit module whose current capacity is about 50 A or lower. However, it is difficult to apply the insulating substrate 500 to a power circuit module whose current capacity exceeds about 50 A.

Another conventional technique relating to an insulating substrate will be described below with reference to the drawings. FIG. 6(a) is a sectional view showing the structure of a conventional insulating substrate 600 in ordinary form, and FIG. 6(b) is a sectional view showing the structure of a conventional insulating substrate including a metal base substrate. As shown in FIG. 6(a), the insulating substrate 600 is provided with a ceramic base substrate 601, a first circuit pattern 602, and a second circuit pattern 603.

The ceramic base substrate 601 is a plate mainly made of alumina ($Al_2O_3$), aluminum nitride (AlN), silicon nitride ($Si_3N_4$), or the like, and has a thickness of about 0.2-0.8 mm. The thermal conductivity is about 20 W/m·K in the case of alumina ($Al_2O_3$), about 160-180 W/m·K in the case of aluminum nitride (AlN), and about 80 W/m·K in the case of silicon nitride ($Si_3N_4$), and hence is one or two orders higher than that of an insulating layer made of an epoxy resin containing an inorganic filler like the insulating layer 502 shown in FIG. 5.

The first circuit pattern 602 is a pattern that is formed under the ceramic base substrate 601. Being metal foil of copper or aluminum, the first circuit pattern 602 is joined to the ceramic base substrate 601 directly or with a brazing material. Usually, the first circuit pattern 602 is merely a solid plate body having no circuit pattern. The first circuit pattern 602 is grounded.

The second circuit pattern 603 is a pattern that is formed above the ceramic base substrate 601. Being metal foil of copper or aluminum, the first circuit pattern 602 is joined to the ceramic base substrate 601 directly or with a brazing material. The second circuit pattern 603 is an ordinary circuit pattern.

In the insulating substrate 600 in which the circuit patterns are formed on both sides of the ceramic base substrate 601 having the high thermal conductivity, heat generated by power semiconductor devices (not shown) mounted on the second circuit pattern 603 is dissipated via the route of the ceramic base substrate 601→the first circuit pattern 602. This enables use of a higher capacity power device and power semiconductor device whose current capacity exceeds 50 A, which cannot be realized by the above-described insulating substrate 500.

FIG. 6(b) shows another structure (module structure) in which a metal base substrate 604 such as a copper plate of 2-3 mm in thickness is joined to the insulating substrate 600 via a solder portion 605.

In this insulating substrate in which the circuit patterns are formed on both sides of the ceramic base substrate 601, heat generated by power semiconductor devices (not shown) mounted on the second circuit pattern 603 is dissipated via the route of the ceramic base substrate 601→the first circuit pattern 602→the solder portion 605→the metal base substrate 604. This enables use of a higher capacity power device and power semiconductor device whose current capacity exceeds 50 A, which cannot be realized by the above-described insulating substrate 500.

The invention of Japanese Patent Publication No. 2004-47863 (paragraphs 0026-0032 and FIGS. 1-3), for example, is another conventional technique relating to a semiconductor device in which improvement of the heat radiation characteristic is intended. This reference discloses a technique of forming a ceramic layer on one surface of a conductive substrate by an aerosol deposition method.

As described above, the use of the insulating substrate 600 incorporating the ceramic base substrate is preferable in applications in which the current capacity exceeds 50 A.

However, there is a problem that the insulating substrate 600 incorporating the ceramic base substrate is expensive for the following reason. To manufacture the insulating substrate 600, first, the ceramic base substrate 601 is formed by firing, at a high temperature, a sheet (called "green sheet") formed by kneading a material powder and a binder together. Then, the first and second circuit patterns 602 and 603 each of which is copper foil or aluminum foil are joined to the ceramic base substrate 601 at a high temperature to complete the insulating substrate 600. As such, the insulating substrate 600 including ceramics as a material requires many manufacturing steps in forming the ceramic base substrate 601, resulting in a high price.

In the semiconductor device of JP 2004-47863, a wiring pattern is formed by an ordinary plating method or the like. There is demand that the total heat radiation characteristic be improved through improvement of the wiring pattern.

The present invention has been made in view of the above-described problems in the art, and an object of the invention is therefore to provide an insulating substrate which is inexpensive because of a reduced number of manufacturing steps, and is superior in heat radiation and insulation performance.

Another object of the invention is to provide a semiconductor device using such an insulating substrate.

Further objects and advantages of the invention will be apparent from the following description of the invention and the associated drawings.

SUMMARY OF THE INVENTION

To attain the above-described objects, an insulating substrate according to a first aspect of the invention comprises a metal base as a base member; an insulating layer which is a room temperature shock solidification film formed on the metal base; and a circuit pattern which is a thermal spray coating formed on the insulating layer.

An insulating substrate according to a second aspect of the invention is such that, in the insulating substrate according to the first aspect, the insulating layer is a ceramic layer of a room temperature shock solidification film that is joined to the metal base by causing ceramic fine particles to collide with the metal base, the ceramic fine particles being made of at least one of silicon oxide, aluminum oxide, silicon nitride, boron nitride, and aluminum nitride.

An insulating substrate according to a third aspect of the invention is such that, in the insulating substrate according to the second aspect, the ceramic fine particles are made of at least one of a first group consisting of silicon oxide and aluminum oxide and at least one of a second group consisting of silicon nitride, boron nitride, and aluminum nitride.

An insulating substrate according to a fourth aspect of the invention is such that, in the insulating substrate according to the first aspect, the insulating layer is a ceramic layer of a room temperature shock solidification film that is joined to the metal base by causing ceramic fine particles to collide with the metal base, the ceramic fine particles being made of at least one of silicon nitride, boron nitride, and aluminum nitride with their surfaces formed with a coating of aluminum oxide.

An insulating substrate according to a fifth aspect of the invention is such that, in the insulating substrate according to the first aspect, the insulating layer is a ceramic layer of a room temperature shock solidification film that is joined to the metal base by causing ceramic fine particles to collide with the metal base, the ceramic fine particles being made of at least one of silicon nitride, boron nitride, and aluminum nitride with their surfaces formed with a coating of silicon oxide.

An insulating substrate according to a sixth aspect of the invention is such that, in the insulating substrate according to any one of the first to fourth aspects, the circuit pattern is a thermal spray coating formed by thermal spraying of a metal that is one of copper, aluminum, nickel, iron, titanium, and molybdenum or an alloy thereof.

An insulating substrate according to a seventh aspect of the invention is such that, in the insulating substrate according to any one of the first to sixth aspects, the insulating layer is a room temperature shock solidification film formed by an aerosol deposition method.

An insulating substrate according to an eighth aspect of the invention is such that, in the insulating substrate according to any one of the first to seventh aspects, the circuit pattern is a thermal spray coating formed by a cold spraying method.

A semiconductor device according to a ninth aspect of the invention comprises the insulating substrate according to any one of the first to eighth aspects; a resin case adhered to the metal base of the insulating substrate; a power device mounted on the circuit pattern of the insulating substrate and placed inside the resin case; and an insulating resin which is charged in the resin case and thereby seals in and isolates from the surroundings the insulating layer and the circuit pattern of the insulating substrate and the power device.

A semiconductor device according to a tenth aspect of the invention comprises the insulating substrate according to any one of the first to eighth aspects; a power device mounted on the circuit pattern of the insulating substrate; and a thermosetting insulating resin formed so as to expose part of the metal base of the insulating substrate to the surroundings and to seal in and isolate from the surroundings the insulating layer and the circuit pattern of the insulating substrate and the power device.

The invention as described above can provide an insulating substrate which is inexpensive because of a reduced number of manufacturing steps and is superior in heat radiation and insulation performance.

The invention can also provide a semiconductor device using such an insulating substrate.

BRIEF DESCRIPTION OF THE DRAWINGS

FIGS. 2(a)-2(d) illustrate a manufacturing method of the insulating substrate;

FIG. 5 is a sectional view showing the structure of a conventional insulating substrate;

FIG. 6(a) is a sectional view showing the structure of an another conventional insulating substrate in ordinary form; and FIG. 6(b) is a sectional view showing the structure of another conventional insulating substrate including a metal base substrate.

DETAILED DESCRIPTION OF THE PREFERRED EMBODIMENTS

Figure 1:
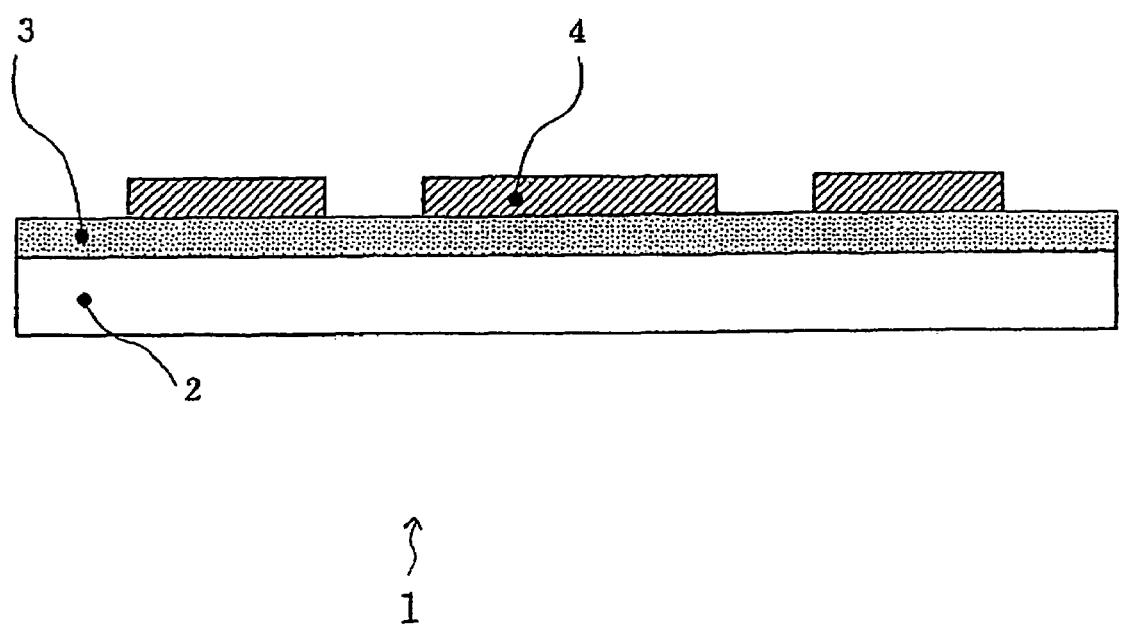
FIG. 1 is a sectional view showing the structure of an insulating substrate according to one embodiment of the present invention.

An insulating substrate and a semiconductor device according to embodiments of the present invention will be hereinafter described with reference to the drawings. FIG. 1 is a sectional view showing the structure of an insulating substrate according to one embodiment of the present invention. The insulating substrate 1 is provided with a metal base 2, an insulating layer 3, and a circuit pattern 4.

The metal base 2 is a metal plate such as an aluminum plate, an aluminum alloy plate, a copper plate, or a copper alloy plate.

The insulating layer 3 is a room temperature shock solidification film formed by an aerosol deposition method. The thickness of the insulating layer 3 is set taking the thermal resistance, the insulation characteristic, etc. into consideration, and is usually set at about 30-400 µm. Formed in a crystal state by the aerosol deposition method, the thermal conductivity of the insulating layer 3 becomes equal to or close to that of the bulk itself even if it is made of any material. The manner of formation of the insulating layer 3 by the aerosol deposition method will be described later.

The insulating layer 3 may be made of any of various kinds of materials. For example, the insulating layer 3 may be a room temperature shock solidification film formed in such a manner that ceramic fine particles of at least one of silicon oxide ($SiO_2$), aluminum oxide ($Al_2O_3$), silicon nitride ($Si_3N_4$), boron nitride (BN), and aluminum nitride (AlN) are room-temperature-shock-solidified by the aerosol deposition method, that is, the ceramic fine particles are joined together through grain boundary phases produced in such a manner that particle surfaces are activated and then combine with each other.

In this case, thermal conductivity of about 1.3-2.0 W/m·K (in the case of silicon oxide ($SiO_2$)), about 20 W/m·K (in the case of aluminum oxide ($Al_2O_3$)), about 80 W/m·K (in the case of silicon nitride ($Si_3N_4$)), 36-75 W/m·K (in the case of boron nitride (BN)), or about 160-180 W/m·K (in the case of aluminum nitride (AlN)) is secured and the heat radiation characteristic is thereby improved.

Among the above materials, silicon oxide ($SiO_2$) and aluminum oxide ($Al_2O_3$) are suitable to increase the adhesiveness in forming a room temperature shock solidification film.

Another method for forming the insulating layer is such that fine particles made of at least one of a first group of materials consisting of silicon oxide ($SiO_2$) and aluminum oxide ($Al_2O_3$) are mixed with fine particles made of at least one of a second group of materials consisting of silicon nitride ($Si_3N_4$), boron nitride (BN), and aluminum nitride (AlN), and the resulting fine particles are room-temperature-shock-solidified by the aerosol deposition method. In this case, a strong coating is formed as a dense ceramic layer because the fine particles of silicon oxide ($SiO_2$) and aluminum oxide ($Al_2O_3$) are combined together strongly.

Still another method for forming the insulating layer 3 is such that ceramic fine particles of at least one of silicon nitride ($Si_3N_4$), boron nitride (BN), and aluminum nitride (AlN) whose surfaces are formed with an aluminum oxide ($Al_2O_3$)coating in advance are room-temperature-shock-solidified by collision by spraying those fine particles on the metal base 2 by the aerosol deposition method. In this case, aluminum oxide ($Al_2O_3$) as the surface coating, and silicon nitride ($Si_3N_4$), boron nitride (BN), or aluminum nitride (AlN) as the core are combined with each other strongly, whereby a dense room temperature shock solidification film is formed.

A further method for forming the insulating layer 3 is such that ceramic fine particles of at least one of silicon nitride ($Si_3N_4$), boron nitride (BN), and aluminum nitride (AlN) whose surfaces are formed with a silicon oxide ($SiO_2$) coating in advance are room-temperature-shock-solidified by collision by spraying those fine particles on the metal base 2 by the aerosol deposition method. In this case, silicon oxide ($SiO_2$) as the surface coating, and silicon nitride ($Si_3N_4$), boron nitride (BN), or aluminum nitride (AlN) as the core are combined with each other strongly, whereby a dense room temperature shock solidification film is formed.

The circuit pattern 4 is a desired circuit pattern that is a thermal spray coating formed on the insulating layer 3 by thermal spraying of a metal that is one of copper, aluminum, nickel, iron, titanium, and molybdenum by a cold spraying method. The material to form the circuit pattern 4 may be an alloy of one of the above-mentioned metals. The circuit pattern 4 that is a thermal spray coating has an advantage that it can provide a high current density even if it is thin because surfaces of its thermal spray particles are in close contact with the insulating layer 3.

The feature that the circuit pattern 4 can be made thin contributes to improvement of the heat radiation characteristic.

Next, a manufacturing method of the insulating substrate 1 will be described with reference to the drawings. FIGS. 2(*a*)-2(*d*) illustrate a manufacturing method of the insulating substrate 1.

FIG. 2(*a*) shows an insulating layer forming process that comprises forming, by the aerosol deposition method, an insulating layer on a metal base 2 that has been formed in advance. More specifically, FIG. 2 (*a*) shows a state in which an insulating layer is being formed by the aerosol deposition method by spraying ceramic fine particles on the metal base 2. The region around the metal base 2 is covered with a mask 5. The mask 5 is approximately as thick as the necessary insulating layer 3.

The aerosol deposition method is a technique for forming a coating on a substrate in such a manner that fine particles or ultra-fine particles as a material are mixed with a gas such as helium or air to form an aerosol. The aerosol is emitted from a nozzle and caused to collide with the substrate, whereby fine particles or ultra-fine particles are deposited on the substrate by room temperature shock solidification.

The fine particles and the ultra-fine particles used in this embodiment are ceramic fine particles as a powder produced by mechanical pulverization (particle diameter: 0.1-2 μm). The description of the aerosol deposition method will continue with an assumption that such ceramic fine particles are made of one of aluminum oxide ($Al_2O_3$), silicon nitride ($Si_3N_4$), boron nitride (BN), and aluminum nitride (AlN).

An apparatus is composed of an aerosol formation chamber and a film formation chamber. The pressure inside the film formation chamber is reduced to about 50 Pa to 1 kPa by a vacuum pump. Aerosol is formed in the aerosol formation chamber by mixing dry ceramic particles as a material with a gas by agitation. Being dry, the ceramic particles do not cohere into large particles.

The apparatus is started in the above-described state, whereupon ceramic fine particles are transported to the film formation chamber being carried by a gas flow caused by the pressure difference between the two chambers. A shredder and a classifier are disposed between the aerosol formation chamber and the film formation chamber. Cohered particles are shredded into ceramic fine particles as they pass through the shredder, and ceramic fine particles having small diameters are allowed to pass through the classifier. By virtue of these measures, only individual ceramic fine particles having small diameters are transported to the film formation chamber. The ceramic fine particles pass through a slit-like nozzle and are thereby accelerated to 100 m/s. The accelerated ceramic fine particles are sprayed on the metal base 2.

Ceramic fine particles whose diameter is in a range of 5 nm to 1 μm collide with the metal base 2 at high speed. Where ceramic fine particles whose diameter is smaller than about several tens of nanometers are used, they combine with each other (part of those are crushed or deformed as described below), whereby a dense ceramic layer is formed. Where ceramic fine particles whose diameter is in a range of several tens of nanometers to 1 μm are used, they are crushed or deformed into pieces whose thickness (size) is in a range of 0.5-20 nm, and crushed pieces combine with each other, whereby a dense ceramic layer is formed. In this ceramic layer, ceramic pieces are combined with each other so densely that no grain boundaries are discernible. A ceramic layer can be formed at room temperature, that is, without the need for temperature increase.

The ceramic fine particles may be made of at least one of silicon oxide, aluminum oxide, silicon nitride, boron nitride, and aluminum nitride. Using ceramic fine particles made of at least one kind of material in this manner makes it possible to form an insulating layer that is so dense that no grain boundaries are discernible.

Alternatively, the ceramic fine particles may be made of at least one of a first group of materials consisting of silicon oxide and aluminum oxide and at least one of a second group of materials consisting of silicon nitride, boron nitride, and aluminum nitride. Where ceramic fine particles made of materials determined by selecting at least one material from each of the two groups of materials are used in this manner, the ceramic fine particles of the first group and those of the second group combine with each other strongly, whereby an insulating layer that is so dense that no grain boundaries are discernible can be formed.

As a further alternative, ceramic fine particles that are made of at least one of silicon nitride, boron nitride, and aluminum nitride, and whose surfaces are formed with an aluminum oxide coating, or ceramic fine particles that are made of at least one of silicon nitride, boron nitride, and aluminum nitride and whose surfaces are formed with a silicon oxide coating, may be used. Where ceramic fine particles whose surfaces are formed with an aluminum oxide coating or a silicon oxide coating, the aluminum oxide or silicon oxide strongly combine with the ceramic fine particles made of silicon nitride, boron nitride, or aluminum nitride, whereby an insulating layer that is so dense that no grain boundaries are discernible can be formed.

For example, the ceramic fine particles may be such that an aluminum oxide or silicon oxide coating having a thickness of 1-100 nm is formed on the surfaces of a core filler made of silicon nitride, boron nitride, or aluminum nitride and having particle diameters of 5 nm to 1 μm. The use of aluminum oxide ($Al_2O_3$), aluminum nitride (AlN), and silicon nitride ($Si_3N_4$) is desirable. It is particularly desirable to use, as a main material, aluminum nitride (AlN) having high thermal conductivity.

The insulating layer 3 thus formed is a ceramic layer in which ceramic fine particles combine with each other densely. Therefore, the insulating layer 3 has a desired breakdown voltage even if its thickness is reduced to several micrometers to 100 μm.

The use of ceramic fine particles whose diameter is in a range of several tens of nanometers to 1 μm is advantageous in terms of the film forming rate of the insulating layer 3. An insulating layer 3 is finally formed as shown in FIG. 2(b) after the spraying of ceramic fine particles that is performed for a prescribed time.

The formation of the above insulating layer 3 provides the following advantages.

(1) Increased Dielectric Breakdown Voltage

In the aerosol deposition method, a film can be formed at room temperature and submicron-order ceramic fine particles are caused to collide with a substrate at a speed that is comparable with the speed of sound. Therefore, ceramic fine particles in which active fresh surfaces are exposed combine with each other, whereby a ceramic fine particle layer that is a very dense insulating film can be formed. Having no voids inside the film, the thus-formed insulating layer 3 exhibits a breakdown voltage per unit length that is about 10 times higher than in ceramic substrates formed by the conventional firing method.

(2) Lowered Thermal Resistance

Since the breakdown voltage per unit length is increased, the insulating layer 3 can be made thinner and hence the thermal resistance of the entire insulating layer 3 can be lowered.

Both improved insulation performance and reduced thermal resistance can be secured as described in the above items (1) and (2). Further, the insulating layer 3 can be adhered to the metal base 2 strongly in a mechanical sense.

After the formation of the insulating layer 3, a circuit pattern 4 as a thermal spray coating is formed on the insulating layer 3.

FIG. 2(c) shows a circuit pattern forming process, that is, a process for forming a circuit pattern 4 by a cold spraying method on the insulating layer 3 that has been formed by the preceding process. FIG. 2(c) shows a state that metal powder is sprayed by the cold spraying method on the insulating layer 3 formed on the metal base 2. The insulating layer 3 is covered with a mask 6. The mask 6 is formed with holes corresponding to a necessary circuit pattern and is approximately as thick as the circuit pattern 4.

The cold spraying method, which is one thermal spraying technique, is such that an ultrasonic flow of a gas whose temperature is lower than the melting point or softening temperature of a thermal spray material and particles of the thermal spray material are put in the flow and thereby accelerated. The particles that are still in the solid phase are caused to collide with a base member at high speed, whereby a coating is formed thereon. The circuit pattern 4 may be formed by a plasma spraying method, a flame spraying method, a high-speed flame spraying method, or the like instead of the cold spraying method.

In the cold spraying method, the temperature of the operating gas for heating and accelerating particles of a thermal spray material maybe very low. More specifically, the temperature of the operating gas may be about room temperature to 600° C. in contrast to the case of the plasma spraying in which the temperature of the operating gas should be as high as 2,000-8,000° C. Thermal spray particles are not heated much, and hence are caused to collide with a base member in a state that they are still in the solid phase. Resulting energy causes plastic deformation in the base member and the particles, and as a result, a coating is formed. Therefore, the manufacturing facilities can be made simpler than in conventional cases, which also contributes to the reduction in manufacturing cost. The manufacturing method of this embodiment is advantageous over other manufacturing methods also in terms of the conductivity and thermal conductivity of a circuit pattern formed.

As for the apparatus used, a high-pressure operating gas is supplied from a gas source such as a gas cylinder to each of a powder supply apparatus and a gas heater. The gas is air, helium, nitrogen, or the like.

Part of the operating gas branches off to be supplied to the powder supply apparatus, and flows to behind a thermal spraying gun as a carrier gas together with thermal spray powder.

Most of the operating gas as a mainstream flows through a coil-shaped gas pipe that is heated directly or indirectly by an electric furnace or the like, and its temperature is increased during that course. The operating gas is then supplied to the thermal spraying gun, and is accelerated by and jetted from an ultrasonic nozzle.

The operating gas is not always heated. However, heating the operating gas is advantageous because it increases the particle speed and facilitates the plastic deformation of particles.

Thermal spraying is started in the above-described state, whereupon thermal spray powder is jetted from the ultrasonic nozzle together with an operating gas.

In the cold spraying shown in FIG. 2(c), metal particles whose diameter is in a range of about 1.0-50.0 μm are used. Examples of the particle material are copper, aluminum, iron, titanium, and molybdenum. Usually, copper or aluminum is used for formation of a wiring board, which is the case in this embodiment. Such metal particles are sprayed on the insulating layer 3 via the mask 6 at a speed of 500-900 m/s from a position that is distant from the insulating layer 3 by 10-50 mm. The metal particles are deposited on the insulating layer 3, whereby a thermal spray coating is formed thereon as the circuit pattern 4 shown in FIG. 2(d). In order to produce a required film thickness, spraying is done for a given time. The thickness of the circuit pattern 4 is set taking the current density into consideration, and is usually set at about 30-500 μm.

The insulating substrate 1 having the three-layer structure is manufactured by the above manufacturing process.

According to the above-described manufacturing method, the ceramic insulating layer 3 can be formed directly on the metal base 2 and the circuit pattern 4 can be formed on the ceramic insulating layer 3. Therefore, the number of manufacturing steps can be made much smaller, and hence the manufacturing cost can be made much lower than in conventional methods for manufacturing a ceramic wiring board. Further, neither of the aerosol deposition method and the cold spraying method requires heating to a high temperature, which also contributes to the reduction in manufacturing cost.

Further, both of the insulating layer 3 and the circuit pattern 4 have an improved heat radiation characteristic, whereby the insulating substrate 1 can be made superior in heat radiation performance to conventional metal base printed wiring boards and is given a high thermal conductivity that is comparable to ceramics. In addition, by virtue of high insulation resistance, the insulating substrate 1 enables the use of high-output-power power devices.

In the above-described manufacturing method, an insulating layer 3 may be formed by the aerosol deposition method in such a manner that the ceramic is caused to adhere to the one major surface and parts of the side surfaces of the metal base 1 continuously by adjusting the opening of the mask 5. This structure is advantageous in attaining a high dielectric breakdown voltage because the creepage distance between the circuit pattern 4 on the insulating layer 3 and the metal base 2 is increased.

Figure 3:
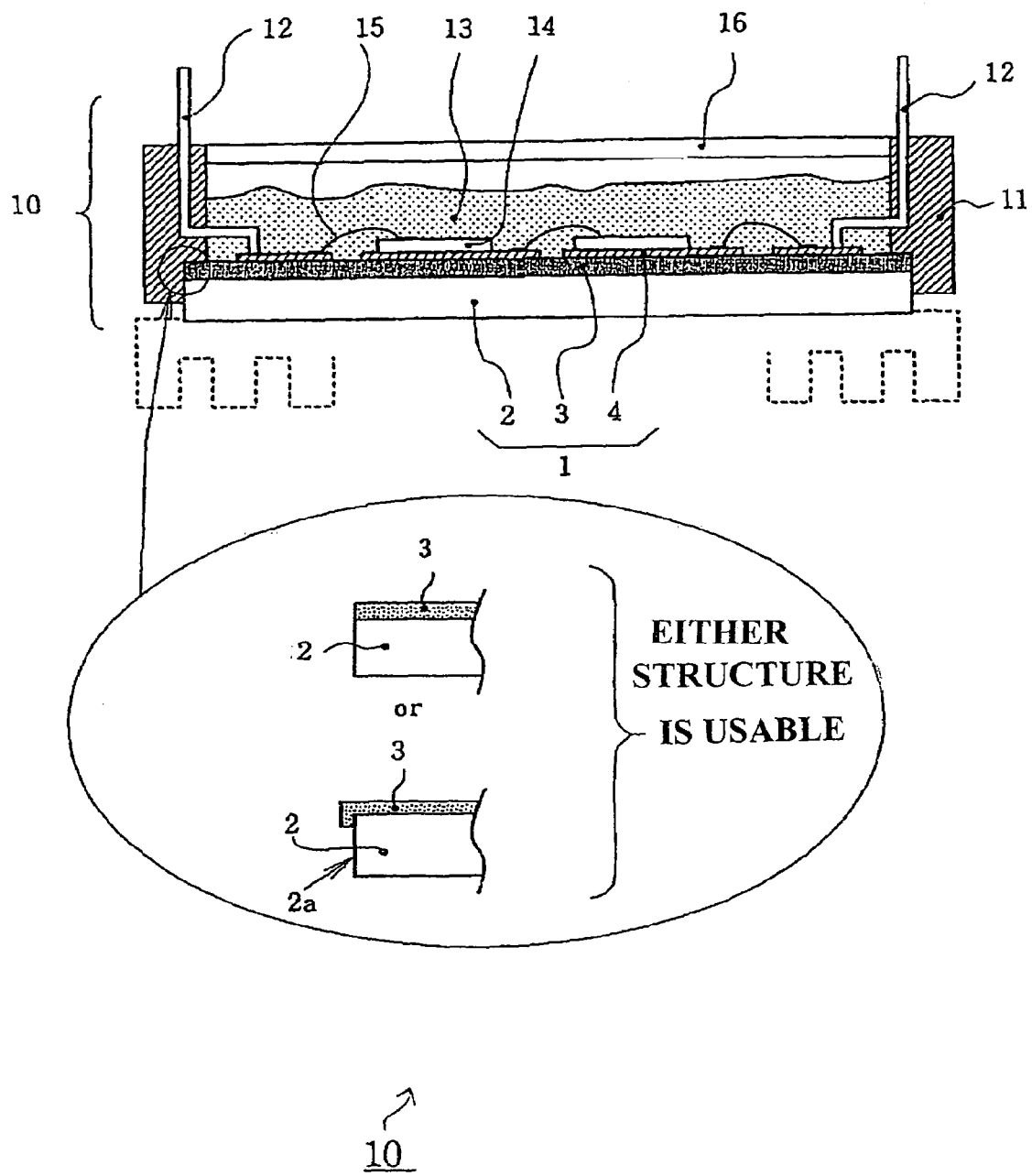
FIG. 3 is a sectional view showing the structure of a semiconductor device according to another embodiment of the invention.

Next, semiconductor devices using the above-described insulating substrate will be described with reference to the drawings. FIG. 3 is a sectional view showing the structure of a semiconductor device according to an embodiment of the invention.

The semiconductor device 10 is a semiconductor module and is provided with an insulating substrate 1, a resin case 11, lead terminals 12, an insulating resin 13, a power device 14, and aluminum wires 15. As shown in FIG. 1, the insulating substrate 1 is composed of the metal base 2, the ceramic insulating layer 3 formed on the metal base 2 by the aerosol deposition method, and the metal circuit pattern 4 formed on the insulating layer 3 by the cold spraying method.

The semiconductor device 10 has a function of supplying electric power. The resin case 11 made of a resin (epoxy resin, PPS, PBT, or the like) and being integral with the lead terminals 12 is adhered to the insulating substrate 1, whereby an accommodation space is formed. The back electrode of the power device 14 and the lead terminals 12 are joined to (connected to and fixed to) the circuit pattern 4 of the insulating substrate 1, and the other electrodes of the power device 14 are connected to the circuit pattern 4 via aluminum wires 15. The accommodation space formed by the resin case 11 is charged with the insulating resin 13 which is made of a silicone gel, an epoxy resin, or the like having high thermal conductivity, whereby the power circuit is sealed in. The opening portion of the resin case 11 is covered with a lid 16 which is made of the same resin (epoxy resin, PPS, PBT, or the like) as the resin case 11.

An intelligent power module may be constructed by forming a control circuit for controlling the power device 14 on another printed circuit board or the like and putting the printed circuit board in the above-mentioned accommodation space.

As shown in a circular enlarged part of FIG. 3, the insulating layer 3 may be such that ceramic adheres to the one major surface and parts of the side surfaces 2a of the metal base 1 continuously. This structure is advantageous in attaining a high dielectric breakdown voltage because the creepage distance between the circuit pattern 4 on the insulating layer 3 and the metal base 2 is increased.

The power device 14 is a power semiconductor device as exemplified by a switching device such as an IGBT (insulated gate bipolar transistor) or an FWD (free wheel diode), and is mounted on the circuit pattern 4 to form a power circuit. If necessary, resistors, capacitors, coils, etc. are also be mounted the circuit pattern 4. In general, the temperature of such a power circuit becomes high due to heat generation of the power semiconductor device, in particular, heat generation caused by a switching operation of a switching device. However, in the semiconductor device 10, the generated heat is dissipated via the insulating substrate 1 having superior cooling performance and heat radiation fins (not shown) fixed to the metal base 2 of the insulating substrate 1.

As for a manufacturing method of the semiconductor device 10, first, the power device 14 is mounted on the circuit pattern 4 of the insulating substrate 1 that was formed by the aerosol deposition method and the cold spraying method. Then, the resin case 11 is joined to the periphery of the insulating substrate 1 with a silicone adhesive or the like. The lead terminals 12 are inserted in and hence are integral with the resin case 11. Then, the necessary power device 14 is electrically connected to the circuit pattern 4 via aluminum wires 15 to form a power circuit. Similarly, the lead terminals 12 are connected to terminal portions of the circuit pattern 4 via aluminum wires 15. Then, the insulating resin 13 such as a silicone gel or an epoxy resin is injected onto the power circuit to insulate and protect the power device 14 etc. and their neighborhoods. Finally, the resin lid 16 is bonded to the opening end of the resin case 11.

Where the semiconductor device 10 is to be constructed as an intelligent power module as mentioned above, a control circuit for controlling the power device 14 is formed on another printed circuit board or the like before the resin lid 16 is bonded in the above process and the printed circuit board is put in the accommodation space. In the inside of the semiconductor device, the printed circuit board can be connected to the power circuit and lead terminals in various manners as exemplified by a wire bonding method and a method that lead terminals for internal connections are provided, inserted through connection through-holes of the printed circuit board, and soldered to the printed circuit board. However, detailed descriptions of these methods are omitted.

Figure 4:
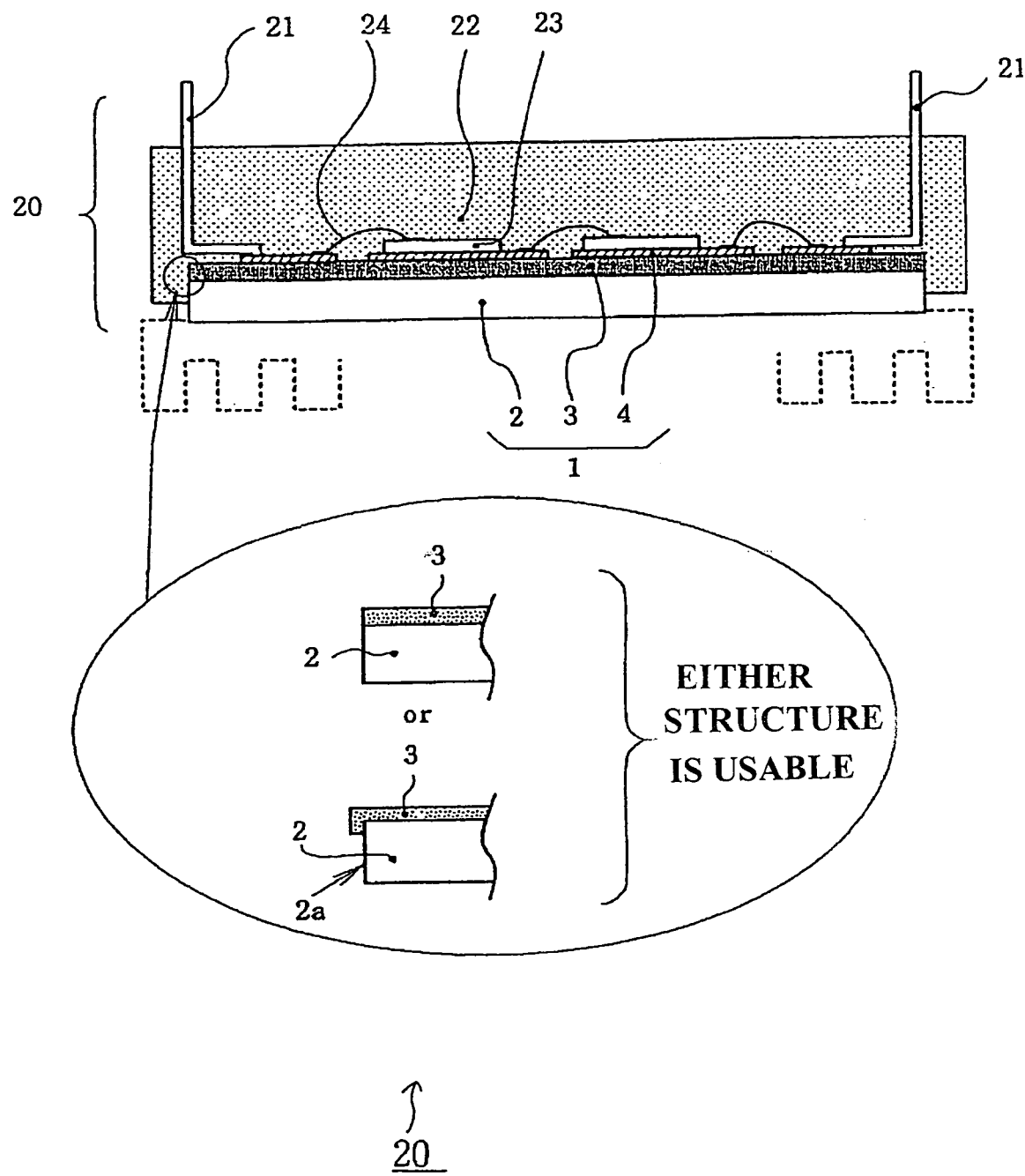
FIG. 4 is a sectional view showing the structure of a semiconductor device according to still another embodiment of the invention.

Next, a semiconductor device according to another embodiment will be described below with reference to the drawing. FIG. 4 is a sectional view showing a semiconductor device according to another embodiment. This semiconductor device 20 is different from the above-described semiconductor device in that a case structure is not employed and an integral structure is realized by an insulating resin 22. The semiconductor device 20 is formed in the following manner. A power device 23 and lead terminals 21 are joined to (connected to and fixed to) a circuit pattern 4 on an insulating layer 3 of an insulating substrate 1, and then connections are made by using aluminum wires 24. Sealing resin is applied to the side of the metal base 2 where the power device 23 is mounted so as to expose the other surface of the metal base 2 on which the insulating layer 3 is not formed, whereby an insulating resin mold 22 is formed. As shown in FIG. 1, the insulating substrate 1 is composed of the ceramic insulating layer 3 which is formed on the metal base 2 by the aerosol deposition method and the metal circuit pattern 4 which is formed on the insulating layer 3 by the cold spray method.

The temperature of the power device 23 becomes high because of heat generation by its switching. Therefore, in the semiconductor device 20, the one surface (i.e., the surface on which the insulating layer 3 is not formed) of the metal base 2 of the insulating substrate 1 is exposed to the surroundings for heat radiation. A power circuit including the power device 23 which is a power semiconductor device or the like is formed on the circuit pattern 4 of the insulating substrate 1, and epoxy resin or the like having high thermal conductivity is applied to the insulating layer 3 and the circuit pattern 4 of the insulating substrate 1 and the power device 23 to form the insulating resin mold 22 in a state that the lead terminals 21 are led outside. The metal base 2 of the insulating substrate 1 is exposed to the surroundings, which improves the cooling performance.

As shown in a circular enlarged part of FIG. 4, the insulating layer 3 may be such that ceramic adheres to the one major surface and the side surfaces 2a of the metal base 1 continuously. This structure is advantageous in attaining a high dielectric breakdown voltage because the creepage distance between the circuit pattern 4 on the insulating layer 3 and the metal base 2 is increased.

A manufacturing method of the semiconductor device 20 is as follows. First, the power device 23 and the lead terminals 21 are soldered to the pattern circuit 4 of the insulating substrate 1 that was formed in advance. Then, the power device 23, the circuit pattern 4, and the lead terminals 21 are electrically connected to each other by aluminum wires 24 by ultrasonic bonding, whereby a power circuit is completed.

Then, the resulting structure is set in a die that is attached to a transfer molding machine. The temperature of the die is kept at 170-180° C. After being subjected to preliminary heating, a tablet-like epoxy resin is poured into the die by means of a plunger. The epoxy resin contains one or more fillers selected from a group consisting of silicon oxide ($SiO_2$), aluminum oxide ($Al_2O_3$), silicon nitride ($Si_3N_4$), aluminum nitride (AlN), and boron nitride (BN) and has a thermal conductivity of 0.5-5.0 W/m·K.

The epoxy resin sets in several tens of seconds from its injection. The structure is taken out of the die immediately after the setting of the epoxy resin, and the epoxy resin is then subjected to post-setting in a thermostatic chamber. An insulating resin mold 22 is thereby formed.

The semiconductor device 20 thus completed is such that the metal base 2 is exposed to the surroundings from the insulating substrate 1 and the insulating layer 3 and the circuit pattern 4 of the insulating substrate 1 and the power device 23 are sealed in and isolated from the surroundings by the insulating resin mold 22.

Each of the semiconductor devices 10 and 20 according to the embodiments has been described above as being a power circuit module, but the invention can be applied to a semiconductor device that is provided with not only a power circuit module but also a control circuit module.

Since the internal circuit is sealed in and isolated from the surroundings by an epoxy resin or the like that is superior in insulation performance, moisture absorption resistance, and the function of blocking a corrosive gas, the semiconductor devices 10 and 20 according to the invention are not susceptible to being deteriorated in insulation performance due to dust introduction or moisture absorption. The devices 10 and 20 are also not susceptible to corrosion of the electrodes of the electronic components due to exposure to a corrosive gas such as hydrogen sulfide.

The probability of occurrence of an arc or spark due to an erroneous electric operation or short-circuiting of the power device 14 or 23 can be lowered, which prevents the entire apparatus from causing a fire.

The above advantages together provide a highly reliable semiconductor device.

While the invention has been described with reference to specific embodiments thereof, the description is illustrative, and the scope of the present invention is limited only by the appended claims.

The disclosures of Japanese Patent Application Nos. 2004-339860 filed on Nov. 25, 2004, and 2005-226990 filed on Aug. 4, 2005, are incorporated herein.

What is claimed is:

1. An insulating substrate comprising:
  a metal base;
  an insulating layer on the metal base, the insulating layer comprising a room temperature shock solidification film; and
  a circuit pattern on the insulating layer, the circuit pattern comprising a thermal spray coating.

2. The insulating substrate according to claim 1, wherein the insulating layer is a ceramic layer of a room temperature shock solidification film which is joined to the metal base by ceramic fine particles that have collided with the metal base, the ceramic fine particles comprising at least one of silicon oxide, aluminum oxide, silicon nitride, boron nitride, and aluminum nitride.

3. The insulating substrate according to claim 2, wherein the ceramic fine particles have a diameter of from 5 nm to 1 μm.

4. The insulating substrate according to claim 2, wherein the insulating layer comprises at least one of a first group consisting of silicon oxide and aluminum oxide, and at least one of a second group consisting of silicon nitride, boron nitride, and aluminum nitride.

5. The insulating substrate according to claim 1, wherein the insulating layer comprises a ceramic room temperature shock solidification film layer that is joined to the metal base by ceramic fine particles that have collided with the metal base, the ceramic fine particles comprising at least one of silicon nitride, boron nitride, and aluminum nitride, with surfaces of the least one of silicon nitride, boron nitride, and aluminum nitride comprising a coating of aluminum oxide.

6. The insulating substrate according to claim 1, wherein the insulating layer comprises a ceramic room temperature shock solidification film layer that is joined to the metal base by ceramic fine particles that have collided with the metal base, the ceramic fine particles comprising of at least one of silicon nitride, boron nitride, and aluminum nitride, with surfaces of the at least one of silicon nitride, boron nitride, and aluminum nitride comprising a coating of silicon oxide.

7. The insulating substrate according to claim 1, wherein the circuit pattern is a metal thermal spray coating comprising one of copper, aluminum, nickel, iron, titanium, and molybdenum, or an alloy thereof.

8. The insulating substrate according to claim 1, wherein the insulating layer is an aerosol deposited room temperature shock solidification film.

9. The insulating substrate according to claim 1, wherein the circuit pattern is a cold sprayed thermal spray coating.

10. The insulating substrate according to claim 1, wherein the thickness of the insulating layer is from 30 to 400 μm.

11. A semiconductor device comprising:
said insulating substrate according to claim 1
a resin case adhered to the metal base;
a power device mounted on the circuit pattern and placed inside the resin case; and
an insulating resin filled in the resin case so as to seal in and isolate from the surroundings the insulating layer and the circuit pattern.

12. A semiconductor device comprising:
said insulating substrate according to claim 1
a power device mounted on the circuit pattern; and
a thermosetting insulating resin formed so as to expose part of the metal base to the surroundings, and to seal in and isolate from the surroundings the insulating layer and the circuit pattern.

13. An insulating substrate comprising:
a metal base;
room temperature shock solidification insulating film means on the metal base; and
thermal spray coating means defining a circuit pattern on the room temperature shock solidification insulating film.

14. A method of forming insulating substrate comprising:
providing a metal base;
forming a room temperature shock solidification insulating film on the metal base; and
thermal spray coating a circuit pattern on the room temperature shock solidification insulating film.

* * * * *